United States Patent [19]

Mattausch

[11] Patent Number: 4,748,595
[45] Date of Patent: May 31, 1988

[54] CIRCUIT ARRANGEMENT COMPRISING A MATRIX-SHAPED MEMORY ARRANGEMENT FOR VARIABLY ADJUSTABLE DELAY OF DIGITAL SIGNALS

[75] Inventor: Hans J. Mattausch, Kirchheim, Fed. Rep. of Germany

[73] Assignee: Siemens Aktiengesellschaft, Berlin & Munich, Fed. Rep. of Germany

[21] Appl. No.: 890,110

[22] Filed: Jul. 28, 1986

[30] Foreign Application Priority Data

Sep. 4, 1985 [DE] Fed. Rep. of Germany ....... 3531613

[51] Int. Cl.[4] .............................................. G11C 7/00
[52] U.S. Cl. .................................................. 365/194
[58] Field of Search ............... 365/189, 194, 230, 239, 365/240

[56] References Cited

U.S. PATENT DOCUMENTS 4,310,901 1/1982 Harding et al. ...................... 365/200
4,520,464 5/1985 Hallauer .............................. 365/189

*Primary Examiner*—James W. Moffitt
*Attorney, Agent, or Firm*—Hill, Van Santen, Steadman & Simpson

[57] ABSTRACT

A circuit arrangement comprising a matrix-shaped memory for variable delay digital signals comprises a selection device for selecting columns of the memory, the selection device being switchable between two selected neighboring columns into which a portion of an external delay time setting data word is supplied for the selection of the columns. A dynamic switching by way of a supplied control signal is provided for switching between two neighboring columns. A setting and control device receives the full external delay time setting data word supplied thereto and generates a reset signal for the memory and a control signal for the selection device, and is supplied with an external reset signal by way of a reset input to directly reset the setting and control device and to indirectly reset the memory. The memory comprises a data input by way of which the data signal to be delayed can be input. The selection device comprises a data output by way of which the delayed data signals can be output. The selection device has data inputs connected to data outputs of the memory and the setting and control device is a data clock controlled device.

2 Claims, 2 Drawing Sheets

4,748,595

CIRCUIT ARRANGEMENT COMPRISING A MATRIX-SHAPED MEMORY ARRANGEMENT FOR VARIABLY ADJUSTABLE DELAY OF DIGITAL SIGNALS

CROSS REFERENCE TO RELATED APPLICATIONS

This application is related to application Ser. No. 828,512 and to application Ser. No. 828,513, both filed on Feb. 12, 1986, and to application Ser. No. 890,115 filed July 28, 1986.

BACKGROUND OF THE INVENTION

1. Field of the Invention

The present invention relates to a circuit arrangement comprising a matrix-shaped memory arrangement for variably adjustable delay of digital signals in which 3-transistor cells having overlapping write/read cycles are provided as storage elements. A row selector which is clocked controlled by an input data clock, continually settable and resettable at any time is provided. The row selector comprises, respectively, two signal outputs per selection stage which are offset in phase relative to one another and which respectively select a write word line or a read word line provided per row of the matrix. Two separate bit lines, namely a write bit line and a read bit line are provided per column, these being respectively interconnected with all memory cells of a column. A disconnectible storage amplifier is provided per column and has an input connected to the read bit line of a column and an output connected to the write bit line of the following column and serving as a data output. A data input for the data signals to be delayed is connected to the write bit line of the first column and to an undelayed data output. A reset input is connected to setting inputs of a first element of the row selector as well as to reset inputs of the remaining elements of the row selector as in the aforementioned application Ser. No. 828,512.

2. Description of the Prior Art

Equipment with whose assistance define delays of digital data streams can be effected are frequently required in the field of digital signal processing, as well as in the field of communications technology. For example, defined delays are employed for time compensation. Given a constant number of desired delay clocks, an arrangement having a shift register is generally available as a delay device. When, however, the delay is to be variably adjustable, certain problems occur in the employment of shift registers.

It is also known to delay data streams in defined fashion by way of an arrangement of standard circuits and storage modules. In such an arrangement, the component parts of the data stream are deposited in a freely-adjustable memory. This memory is driven by a decoder which is, in turn, driven by one (or more) counters. The duration of the delay is thereby established by the duration of the counter reset pulses. Since the memory cells of such freely-addressable memories can only respectively read or write per clock, the necessity thereby occurs that the memories are either operated with twice the clock rate or switching must be carried out back and forth between two memory units in a multiplex mode. The first solution of this problem has the disadvantage that the maximum data clock frequency can only be half as great as the maximum memory cycle frequency. The solution of the latter problem requires involved circuits for address control and a required reordering of the data. For an integratible realization of such a circuit arrangement, moreover, disadvantages arise as a consequence of the high space requirement of the necessary multiplexers and because of the extensive wiring required.

It was the object of the aforementioned application Ser. No. 828,512 to provide a circuit arrangement by way of which defined, variably adjustable delays can be achieved, this be realizable by way of an integrated circuit arrangement which requires a low surface requirement and allows higher data rates in comparison to the known art. In particular, the object was comprised in creating a circuit arrangement which is particularly suitable for integration in metal-oxide-semiconductor (MOS) technology. In application Ser. No. 828,512, the object was achieved, according to that invention, by the provision of a circuit arrangement for a variably adjustable time delay of digital signals which comprises a matrix-shaped memory and which is particularly characterized in that known three-transistor memory cells having overlapping write/read cycles are provided as storage elements, in that a continuously steppable row selector is provided which can be reset at any time and which is clocked by the input data clock. The row selector comprises two respective, mutually phase offset signal outputs per selection stage which respectively drive a write word line or a read word line per row of the matrix-shaped memory, and in that two separate bit lines are provided per column, a write bit line and a read bit line which are respectively interconnected to all memory cells of a column. Furthermore, a disconnectible storage amplifier is provided per column and has an input connected to the read bit line of the column assigned thereto and an output connected to the write bit line of the following column and serving as a data output. A data input for the data signals to be delayed is connected to the write bit line of the first column and to an undelayed data output. A reset input is connected to setting inputs of the first element of the row selector as well as to the reset inputs of the remaining elements of the row selector. The chronological spacing between reset pulses is selected such that it equals the required delay time which is to be set between the undelayed data output and the first delayed data output.

SUMMARY OF THE INVENTION

The present invention represents an improvement over the circuit arrangement of Ser. No. 828,512.

This improvement is based on the object of improving the specific circuit arrangement in view of the variability of the time delay and in view of the circuit-oriented expense.

The object of the invention is achieved by a circuit arrangement of the type set forth above which is particularly characterized in that a selection device is provided for selecting the columns, the selection device being switchable between two selected, neighboring columns and being supplied with a portion of an external delay time setting word for the selection of these columns, in that a dynamic switching by way of a supply control signal is provided for switching between the two neighboring columns, and in that a setting and control device is provided which is supplied with the full external delay time setting data word, guaranteeing a reset signal for the memory arrangement and control signal for the selection device and being supplied with an external reset signal via a reset input for direct resetting the setting and control device and indirect resetting of the memory arrangement. In addition, the memory arrangement comprises a data input by way of which the data signal to be delayed can be input, the selection device comprises a data output by way of which the delay data signals can be output, the selection device has data inputs connected to data outputs of the memory arrangement, and the setting and control device is a data clock controlled device.

BRIEF DESCRIPTION OF THE DRAWINGS

Other objects, features and advantages of the invention, its organization, construction and operation will be best understood from the following detailed description, taken in conjunction the accompanying drawings, on which.

DESCRIPTION OF THE PREFERRED EMBODIMENTS

Figure 1:
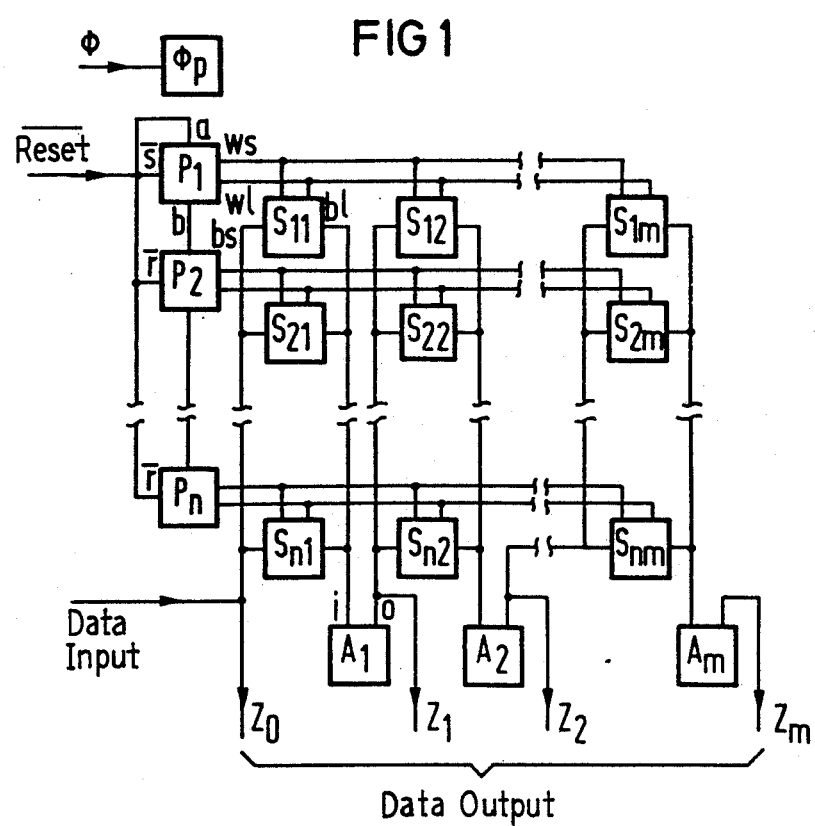
FIG. 1 is a schematic circuit diagram of the circuit arrangement of application Ser. No. 828,512 and to which the present invention can be applied and which is referred to as a memory arrangement SP hereinbelow.

As already set forth above, FIG. 1 illustrates a preferred exemplary embodiment of a circuit arrangement constructed in accordance with the present invention for variably adjustable time delay of digital signals and comprising a matrix-shaped memory arrangement.

The illustrated circuit arrangement includes a data input D, a reset input $\overline{Reset}$, a clock input $\phi$ which synchronizes a clock control $\phi_P$, as well as a plurality of data outputs $Z_0 \ldots Z_m$. A row selector having a plurality of stages $P_1 \ldots P_n$ is also provided, wherein the stages in a row are interconnected, wherein the first stage $P_1$ has a setting input $\bar{s}$ and a signal input a and the remaining stages $P_2 \ldots P_n$ have their respective reset inputs $\bar{r}$ connected to the reset input $\overline{Reset}$, wherein respectively one signal output b is connected to the signal input a of the following stage, and wherein a write word line ws and a read word line wl are respectively provided per stage. Known three-transistor memory cells with overlapping write/read cycles are employed as storage elements in the matrix-shaped arrangement (cf. FIG. 1). The continuously steppable row selector $P_1 \ldots P_n$ which can be reset at any time is clock-controlled by an input data clock. Per selection step, namely per stage, it comprises two signal outputs which are offset in phase relative to one another, namely the write word line ws and, respectively, the read word line wl, which are provided per row of the matrix. Two separate bit lines, namely a write bit line bs and a read bit line bl, are provided per column in the memory arrangement, these being respectively interconnected to all memory cells of a column. Moreover, a disconnectible, storage amplifier $A_1 \ldots A_m$ is provided per column, the input i thereof being connected to the appertaining read bit line bl of a column assigned thereto and the output o thereof being connected to the write bit line bs of the column following thereupon and serving as data outputs $Z_1 \ldots Z_m$ assigned to the respective amplifiers. The data input D for the data signals to be delayed is connected to the write bit line bs of the first column and to an undelayed data output $Z_0$. The further data outputs $Z_1 \ldots Z_m$ are time delayed such in comparison to the undelayed signal output $Z_0$ that the chronological spacing between reset pulses $\overline{Reset}$ is selected such that it equals the required delay time which is to be set between the undelayed data output $Z_0$ and the first time-delayed data output $Z_1$.

Figure 2:
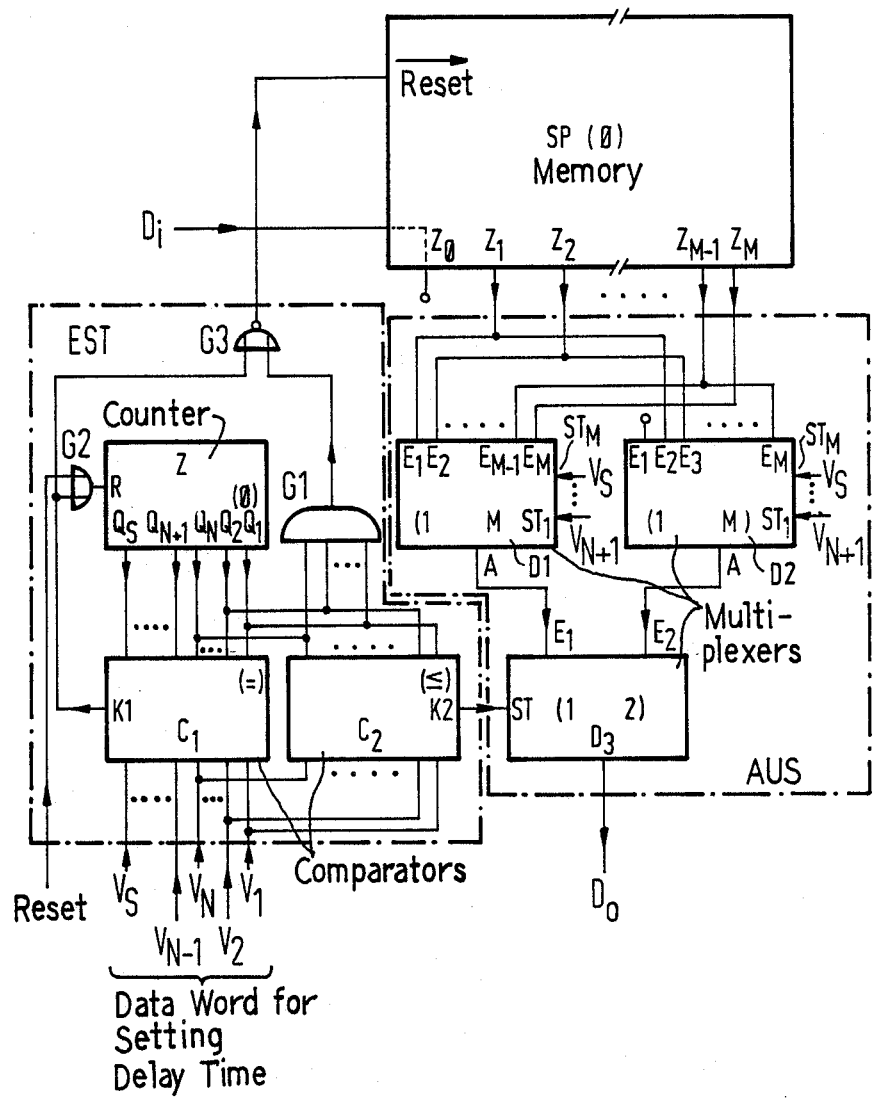
FIG. 2 is a basic circuit diagram of the circuit arrangement of the present invention in which the memory arrangement SP is contained.

As illustrated in FIG. 2, a selection device AUS for selecting columns of a memory arrangement SP is provided, this being switchable between two selected, neighboring columns and a portion of an external delay time setting data word for the selection of these columns is supplied thereto. A dynamic switching by way of a control signal ST supplied to the selection device AUS is provided for switching between the two, neighboring columns. Moreover, as may be seen in FIG. 2, a setting and control device EST is provided, the full external delay time setting data word being supplied thereto. The setting and control device EST generates a reset signal $\overline{Reset}$ for the memory arrangement SP and generates a control signal for the control input ST of the selection device AUS. The setting and control device EST is supplied with an external reset signal Reset via a Reset input. The reset signal is used in order to directly reset the setting and control device EST and in order to indirectly reset the memory arrangement SP. The memory arrangement SP comprises a data input $D_i$ by way of which the data signal to be delayed can be input. The selection device AUS comprises a data output $D_o$ by way of which the delayed data signals can be output. The selection device AUS has data inputs $E_1$-$E_M$ connected to data outputs $Z_1$-$Z_M$ of the memory arrangement SP. The setting and control device EST is a data clock controlled device.

The selection device AUS is composed of an arrangement comprising a first multiplexer D1, a second multiplexer D2 and a third multiplexer D3, whereby data outputs $Z_1$-$Z_M$ of the memory arrangement SP are respectively connected to the data input $E_1$-$E_M$ of the first multiplexer $D_1$ and to data inputs $E_2$-$E_M$ of the second multiplexer D2 given offset by one place, whereby the last data output $Z_M$ of the memory arrangement SP is not connected to one of the data inputs of the second multiplexer D2, and whereby the first data input E1 of the second multiplexer D2 remains free. Respective selection inputs $ST_1$-$ST_M$ are provided for each of the two multiplexers D1, D2, these selection inputs being charged with a defined portion of the external delay time setting data word and by way of which the output A thereof is respectively connectible in the multiplexers D1, D2 to one of the data inputs, for example the input $E_2$ in the first multiplexer D1 or, respectively, $E_2$ in the second multiplexer D2. The two outputs A, A of the multiplexers $D_1$, $D_2$ are connected to the two single data inputs $E_1$, $E_2$ of the third multiplexer D3, whose output A represents the data output $D_o$ for the delayed input data and which comprises a single control input ST.

The setting and control device EST contains a counter Z, a first comparator $C_1$, a second comparator $C_2$ and AND gate G1, and OR gate G2 and a NOR gate G3. The counter Z comprises a plurality of counting stages which corresponds to the plurality of memory locations of the memory arrangement SP. The first comparator $C_1$ comprises the function "equal". The second comparator $C_2$ comprises the function "equal to or less than". The setting and control device EST has a plurality of setting inputs $V_1$-$V_N$, $V_{N+1}$-$V_S$ for applying the external delay time setting data word and has a reset input Reset, whereby the setting inputs are divided into a first group for the low-order bits of the delay time setting word comprising the setting inputs $V_1-V_N$, and into a second group for the high-order bits comprising the setting inputs $V_{N+1}-V_S$. An arbitrary row of the memory arrangement SP is identified in coded form by way of the setting inputs $V_1-V_N$ of the first group. This identification serves as a first comparison value for the second comparator $C_2$. The appertaining row or, respectively, an arbitrary column is identified in coded form by way of the setting inputs of both the first and second groups. These identifications serve overall as a first comparison value for the first comparator $C_1$. The first comparator $C_1$ has a plurality of comparison value inputs corresponding to data outputs $Q_1-Q_N$, $Q_{N+1}-Q_S$ of the counter Z to which a counter reading data word corresponding to the respective counter reading of the counter Z is supplied. The second comparator $C_2$ has a plurality of comparison value inputs corresponding to the data outputs $Q_1-Q_N$ of a first group of data outputs at the counter Z to which the low-order bits of the counter reading data word corresponding to the respective counter reading are supplied. These latter bits are likewise supplied to the AND gate G1 by way of a corresponding number of inputs. The first comparator $C_1$ has a comparison output K1 which is connected to one of the two inputs of the OR gate G2 and to one of the two inputs of the NOR gate G3 and which emits an output signal in accordance with the condition $$K_1=\{Q_1-Q_S\}=\{V_1-V_S\}$$

The second input of the OR gate G2 is connected to the reset input of the setting and control device EST. The second input of the NOR gate G3 is connected to the output of the AND gate G1. The reset input of the memory arrangement SP is charged with the output signal of the NOR gate G3. A reset input R of the counter Z is fed by the output signal of the OR gate G2. A comparison output K2 of the second comparator $C_2$ is connected to the control input ST of the third multiplexer D3. The second comparator $C_2$ emits an output signal to the comparison output K2 in accordance with the condition $$K_2=\{Q_1-Q_N\}\leq\{V_1-V_N\}$$

in which case the first data input $E_1$ of the third multiplexer D3 is connected to the data output $D_o$.

The number of matrix-shaped memory arrangements SP can be provided in accordance with the word widths of the input data in accordance with a further feature of the invention, the write word lines or, respectively, read word lines of these memory arrangements SP being connected in parallel and being connected to the line selector provided in common for these matrix-shaped memory arrangements SP.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a memory of the type in which a plurality of three-transistor memory cells are arranged in a matrix of rows and columns and are operated with overlapping write/read cycles, a row selector comprises a plurality of serially connected stages and is clocked by an input data clock and is continuously steppable and arbitrarily resettable at any time, the row selector comprising two signal outputs per stage which are offset in phase relative to one another and respectively connected to and for selecting a write word line and a read word line each of which is connected to each cell of the respective row, in which a write bit line and a read bit line are provided per column and connected to each cell of the respective column, in which a plurality of disconnectible storage amplifiers is provided and each amplifier includes an input connected to the read bit line of a respective column and an output connected to the write bit line of the adjacent column and further serving as a delayed data output, in which the row selector stages each include a reset input connected to a common reset input for receiving a row selector reset signal, the first stage of the series further including a set input connected to said common reset input for receiving the row selector input signal to set the row selector to the respective row of cells, and in which a data input for receiving data signals to be delayed is connected to the write bit line of a first column and to an undelayed data output, the improvement comprising:

a column selector for selecting columns of the memory, said column selector comprising a plurality of data inputs connected to the undelayed and delayed data outputs, a delay setting input for receiving a portion of a delay time setting word defining a selection of a column, a control signal input for receiving a control signal, and switching means operable in response to said control signal to select the column corresponding to the time delay defined by said portion of the delay time setting word; and a data clocked control means including an input for receiving the complete delay time setting word, an input for receiving an external reset signal, a control signal output connected to said control signal input of said column selector, a reset output connected to the common reset input of the row selector, and means responsive to said external reset signal and to said delay time setting word to reset said control means and the row selector.

2. The improved memory of claim 1, wherein:

said column selector comprises first, second and third multiplexers each including a plurality of inputs and an output said third multiplexer further including said control signal input, said inputs of said first multiplexer connected to said delayed outputs of said memory, said inputs of said second multiplexer connected to said delayed outputs of said memory offset by one place such that the most delayed data output is only connected to said first multiplexer and the first input of said second multiplexer remains free of connection, said outputs of said first and second multiplexers connected to said inputs of said third multiplexer and said output of said third multiplexer serving as a data output for said memory;

said first and second multiplexers each including a plurality of inputs constituting said delay setting input for establishing a data path through said first and second multiplexers to said third multiplexer;

said delay time setting data word divided into a plurality of low-order bits and a plurality of high-order bits;

said control means comprises a clocked counter including a reset input and a plurality of stages equal in number to the number of memory locations and each including an output, first and second comparators each including a plurality of inputs connected to at least some of said outputs of said counter and each including a plurality of setting inputs constituting said input for receiving said complete delay time setting word, said first comparator operable to compare said counter output to said complete time delay data word on an "equal to" basis and said second comparator operable to compare said counter output with a plurality of low-order bits of said time setting data word on an "equal to or less than" basis, said first comparator including an output and operable to produce a reset signal at said output and said second comparator including an output connected to said third multiplexer control signal input and operable to provide said control signal;

an external reset signal input;

an AND gate including a plurality of inputs connected to said counter outputs, and an output;

an OR gate including a first input connected to said output of said first comparator, a second input connected to said external reset signal, and an output connected to said reset input of said counter; and a NOR gate including a first input connected to said output of said first comparator, a second input connected to said output of said AND gate, and an output connected to said common reset input of said memory, said first and second comparators operable to produce respective output signals K1 and K2 in accordance with the relationships $$K1 = \{Q_1 \ldots Q_S\} = \{V_1 \ldots V_S\}$$

$$K2 = \{Q_1 \ldots Q_N\} \leq \{V_1 \ldots V_N\},$$

where $Q_1 \ldots Q_N$ is the low order and $Q_{N+1} \ldots Q_S$ is the high order of the counter output sequence and $V_1 \ldots V_N$ are the low-order bits and $V_{N+1} \ldots V_S$ are the high-order bits of the delay time setting data word, and where K1 establishes internal reset and K2 causes said third multiplexer to select said output of said first multiplexer.

* * * * *